United States Patent [19]

Austerman

[11] 4,217,167
[45] Aug. 12, 1980

[54] METHOD OF GROWING LARGE LOW DEFECT, MONOCRYSTALS OF BEO

[75] Inventor: Stanley B. Austerman, Villa Park, Calif.

[73] Assignee: Rockwell International Corporation, El Segundo, Calif.

[21] Appl. No.: 864,967

[22] Filed: Dec. 27, 1977

[51] Int. Cl.² .............................................. B01J 17/04
[52] U.S. Cl. ............................ 156/624; 156/DIG. 65
[58] Field of Search .............. 156/605, 622, DIG. 65, 156/DIG. 78, 624; 423/624; 148/171; 252/62.3 E, 62.3 R

[56] References Cited
U.S. PATENT DOCUMENTS 2,484,829  10/1949  Holden ................................. 156/622

OTHER PUBLICATIONS

Journal of Nuclear Materials, 14 (1964), pp. 225–236, Austerman et al.
Journal of Materials Science, 1 (1966), pp. 249–260, Austerman et al., and 2 (1967), pp. 378–387.
Journal of Applied Physics, Austerman et al., vol. 36, No. 12 (1965), pp. 3815–3822.
Crystal Growth, 1967, pp. 813–815, Austerman, et al.
Journal of Applied Crystallography, V1, part 3, Sep. 1968, pp. 165–171, Chikawa et al.

Primary Examiner—Hiram H. Bernstein
Attorney, Agent, or Firm—H. Fredrick Hamann; Richard A. Bachand; Gilbert H. Friedman

[57] ABSTRACT

Careful control of flux composition, growth habit and growth conditions leads to rapid growth of substantially defect-free large monocrystals of BeO.

16 Claims, 5 Drawing Figures

METHOD OF GROWING LARGE LOW DEFECT, MONOCRYSTALS OF BEO

BACKGROUND OF THE INVENTION

1. Field of the Invention

The invention relates to the field of the growth of bulk monocrystalline BeO from flux melts.

2. Prior Art

Prior art bulk monocrystalline BeO has been grown from flux melts of lithium or potassium molybdate including growth modifying impurities present in ranges from nil to 1% by weight of the molybdate flux. Thermal gradient transport of BeO from a polycrystalline BeO source to monocrystalline seed plates has been utilized. The prior art procedure for providing seed plates has been to slice, trim and drill monocrystalline BeO seed plates and support them by platinum wires passing through a hole drilled in the seed plate. These seed plates have been carefully selected to be substantially free of such defects as inclusions, dislocations and twin boundaries. These seed plates are prepared with a $(10\bar{1}0)$ crystal face as a major growth face because additional monocrystalline BeO grows rapidly on this face. However, as growth proceeds on the $(10\bar{1}0)$ faces of the seed plate, they are inherently replaced by faces such as $(10\bar{1}1)$ and vicinal $(000\bar{1})$ all of which grow at markedly lower rates than the $(10\bar{1}0)$ faces. Because of this inherent replacement of a fast growing face by slower growing faces, the growth of large crystals in this manner is very time consuming. The $(10\bar{1}0)$ face may grow at a rate of one-half to one millimeter per week whereas the replacement faces grow at much slower rates on the order of 0.001 to 0.01 millimeter per week. The growth of additional material on the seed plates is accomplished in a supersaturated region of the flux. This results in both the growth of additional BeO on the seed plates and the undesired nucleation of additional crystals on the surfaces of the crucible and crystal support rig. These newly nucleated crystals can lead to defects in the seed plates when excessive nucleation takes place and limit the length of growth runs by physical interference with the desired crystals. Excessive nucleation can also cause a reduction in the supersaturation of the melt because of increased deposition area. This reduction in supersaturation reduces the rate of growth of the desired crystal. Consequently, it is necessary to periodically remove the seed crystals from the melt and remove undesired crystals from the crystal support rig and the surfaces of the crucible. The crystals so removed may be returned to the BeO source for use as BeO source materials in subsequent growth runs.

SUMMARY OF INVENTION

The prior art problems in rapidly growing low defect monocrystalline BeO are overcome in accordance with the present invention by careful control of the flux composition, growth temperature and crystal morphology. This yields a maximum growth rate and induces nucleation of crystals having a favorable growth habit having fast growing faces which do not grow out of existence and which introduce a minimal number of inclusions and other defects into the crystal structure. A flux comprised of potassium molybdate is utilized. In addition to solute BeO, the flux has added to its impurities to control growth habit and to prevent inclusion formation while maximizing growth rate. Impurities are present in the range from 0.002 weight percent to 0.101 weight percent of the flux. The preferred growth habit is a pyramid having an inversion twin core with an axial screw dislocation. The point of the pyramid is the intersection of $\{10\bar{1}1\}$ planes each of which is bounded at its opposing end by a $\{10\bar{1}0\}$ face which in turn is bounded by adjacent $\{10\bar{1}0\}$ faces and a vicinal $(000\bar{1})$ face which forms a reentrant angle with $\{10\bar{1}1\}$ faces of the axial core at the inversion twin boundary between the host crystal and the axial core. When crystals of the preferred growth habit nucleate on support wires, the $\{10\bar{1}1\}$ faces of the crystal usually converge at the support wire. Large crystals obtained utilizing this growth habit may be sliced to yield desired orientations of twin-free monocrystalline BeO plates, which if desired may be used as seed plates for further growth.

DETAILED DESCRIPTION OF THE PREFERRED EMBODIMENT

Figure 1:
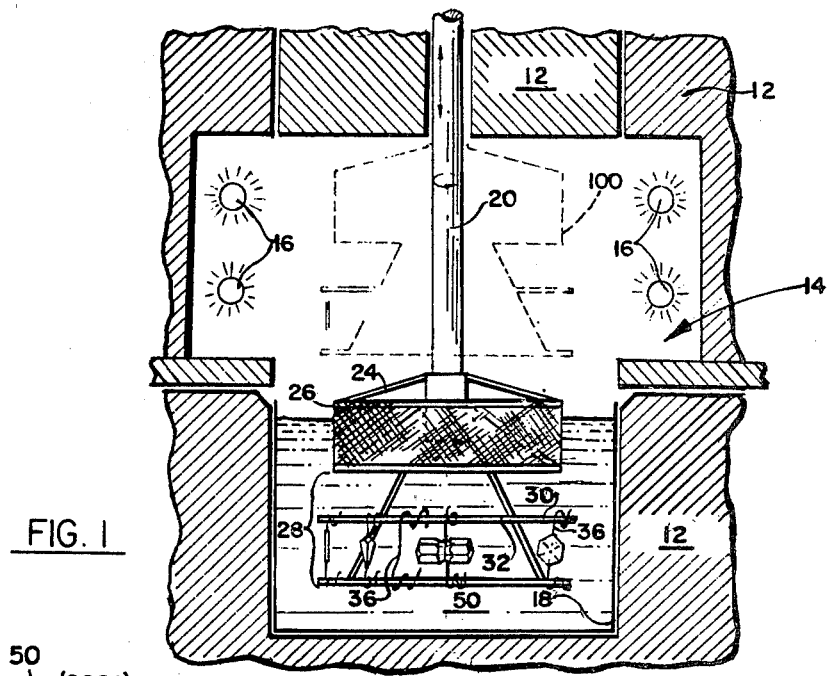
FIG. 1 is a cross-section diagram schematically illustrating crystal growth apparatus suitable for use in growing the BeO crystals of this invention.

In accordance with the invention, monocrystalline BeO crystals are grown from a flux melt utilizing a thermal gradient in the melt to transport BeO from a solid source through the flux to a deposition location where super-saturation of BeO is maintained. An illustrative apparatus for growing crystals in accordance with the invention is illustrated schematically in FIG. 1. A furnace includes a fire brick or other thermally insulating material 12 to isolate the interior of the furnace from external convection transport of heat by gases. The brick structure contains an internal cavity 14 adapted to contain a crucible 18. In the illustrative embodiment of FIG. 1, the cavity 14 also contains heating elements 16 for heating the crucible and the flux 50 therein to temperatures appropriate for the growth of BeO crystals. The heating elements 16 are located in the upper portion of cavity 14 above the crucible in order to maintain the upper portion of the crucible at a higher temperature than the temperature at which the lower portion is maintained. A crystal support structure or rig 22 may be suspended in the flux 50 within the crucible 18 in order to grow BeO crystals from the flux. Crystal support rig 22 includes support rods or wires 24 for suspending rig 22 from an overhead support shaft 20. The upper portion 26 of the crystal growth rig comprises a platinum screen basket for containing the solid BeO source material. The screen basket prevents crystal fragments of the BeO source material from falling into the melt where they would sink to the bottom of the crucible. Such crystals would undesirably increase the number of crystals in the saturated portion of the flux on which the BeO would deposit. Platinum is utilized for the crucible and support rig because platinum is essentially inert to the crystal growth flux. The lower portion 28 of growth structure 22 comprises a structure 30 of crystal support rods 32. Individual crystal support wires 36 are attached to the rods 32 to suspend crystals within the flux for the deposition of BeO thereon. Additionally, other wires 36 having no seed crystal attached thereto may be suspended from the bars 32 for the nucleation of new seed crystals in the supersaturated lower portion of the melt near the crucible bottom. The cavity 14 has an upper portion in which the crystal support rig 22 may be held while the furnace is being heated or cooled. In FIG. 1, the position of the crystal support rig in this elevated position is illustrated in phantom at 100.

During operation, a thermal gradient is maintained within the flux 50 by the introduction of heat at the top of the flux via the heaters 16 and the conduction of heat away from the bottom of the flux through the crucible 18 and the fire brick or other insulator 12 on which the crucible rests. In consequence of this temperature gradient, BeO within the screen basket 26 slowly dissolves into the hotter upper portion of the flux 50 and then diffuses through the flux to the lower temperature portion of the flux. Rotating the support rig 22 during growth creates a stirring action which aids the diffusion of the BeO into the lower portion of the melt. The diffusion of the dissolved BeO into the lower portion of the flux results in supersaturation of that portion of the flux. BeO deposits from the supersaturated flux onto existing BeO crystals and/or nucleates new BeO crystals in accordance with the degree of supersaturation of the lower portions of the flux. Support rig 22 is preferably rotated about the axis defined by support shaft 20 at a rate of between 10 rpm and 100 rpm during a growth run in order to stir the melt.

The flux is an alkali metal molybdate flux having metal oxides added thereto as flux conditioners to control crystal growth. Other metal compounds may be added to the flux instead of the oxides in order to provide the desired quantities of metal ions. The preferred flux is potassium molybdate which may be prepared from 10 to 50 weight percent $K_2CO_3$ and 90 to 50 weight percent $MoO_3$. A composition containing approximately 25 weight percent $K_2CO_3$ and 75 weight percent $MoO_3$ is preferred. In addition, the flux contains 0.002 to 0.1 weight percent of melt conditioning impurities.

Impurities were initially introduced into melts in the prior art because the presence of significant quantities of impurities was considered necessary to prevent the formation of inclusions and other defects. Without impurities (i.e., "pure" flux), inclusions were universally formed. The large concentrations in which impurities were introduced suppressed most defect formation without appearing to cause any deleterious effects. Further research has revealed additional causes of defect formation in the growing crystal.

In growing additional material on a seed plate having $(10\bar{1}0)$ orientation, it is essential for the attainment of good quality overgrowth that the face of the seed plate which is intended to be a $(10\bar{1}0)$ face be parallel to the $(10\bar{1}0)$ crystallographic plane of the crystal within an angle of about one or two degrees. If this surface is off orientation by more than that amount, rapid growth at an angle to the surface of the seed plate results in formation of excessive numbers of inclusions within the overgrown material.

Bulk defects in the seed plate may propagate into newly grown material or cause local inclusions. Such defects are often introduced by machining operations and by mechanical interference of adjacent crystals which have spontaneously nucleated on the bottom of the crucible. Care must be taken in the handling of seed plates to assure that they do not suffer surface damage. Even where there is no visible surface damage, defects may be generated by rough handling. These defects will propagate into newly overgrown material with a result that the new material is of lower quality. Surface damage can result from rough handling, machining such as slicing or drilling or the accidental knocking together of crystals. Surface damage from slicing of crystals is preferably removed by mechanically polishing the crystals and then shallow etching them to remove the damage left by the polishing process. Crystals which have been subject to rough handling should have damaged portions removed by a shallow etch prior to their use as seed plates for overgrowth.

Machining-induced defects are minimized by the use of seed crystals which spontaneously nucleated on seed support wires since all machining operations may be avoided with those crystals until they have reached a size where it is desired to slice them into wafers. Crystals which nucleate on the floor or walls of the crucible may also be used, but usually must have holes drilled therethrough in order that support wires may be attached thereto.

With other causes of defect formation under improved control, it has been found that the impurity concentrations used in the prior art induce a significant decrease in the crystal growth rate under what can be achieved with the reduced impurity concentrations specified hereinafter.

If the impurity concentration is made larger, the growth rate of the crystals is significantly reduced. A significant reduction in the growth rate of the crystals results in increased supersaturation of BeO in the flux because the rate of dissolution of the BeO source in the hot part of the flux is not strongly affected by moderate increases in the supersaturation of the cooler portions of the flux. The increased supersaturation of the melt tends to cause increased spontaneous nucleation of BeO crystals on the crucible bottom and crystal support rig. These spontaneously nucleated crystals can interfere directly with the growth of desired crystals in the event they nucleate on existing crystals or close to them on support wires. Further, even if nucleated elsewhere, these crystals as they grow can extend into the area swept by existing crystals, thus producing defects due to intercrystal abrasion. If sufficient spontaneous nucleation takes place, the overall rate of bulk deposition of BeO from the supersaturated portion of the flux may actually increase as the growth run proceeds because of a vastly increased deposition area. An increased deposition rate (on spontaneously nucleated crystals) reduces the supersaturation of the flux to below the desired amount with the result that the growth rate of the desired crystals is still further reduced.

For the above reasons, proper control of the quantity of the conditioner present in the flux along with other growth conditions is important and can be utilized both to control the growth rate of existing crystals and to suppress or depress the rate at which competive spurious crystals nucleate. The preferred impurities are $SiO_2$ and $K_2Cr_2O_7$, each in the concentration range of 0.001-0.1 weight percent, with the total impurity concentration preferably maintained at about 0.1 weight percent or less of the potassium molybdate source materials. The $K_2Cr_2O_7$ may be replaced by MgO, $Al_2O_3$, CaO, $Fe_2O_3$ or other impurities in approximately the same weight percentages. The preferred concentration of the impurities in the flux is 0.005 weight percent $SiO_2$ and 0.07 weight percent $K_2Cr_2O_7$. This combination of impurities in these concentrations in the preferred flux mixture has been found to yield a near maximum growth rate while almost completely preventing the formation of inclusions and other defects within the growing BeO crystal. The lower limits of 0.001 weight percent on the $SiO_2$ and the $K_2Cr_2O_7$ have been then experimentally established as the minimum which yields high quality crystals. The upper limit of 0.1 weight percent for $SiO_2$ is dictated by increased stress in the BeO crystal which leads to poor crystal quality. The upper limit of 0.1 weight percent on the $K_2Cr_2O_7$ is for the attainment of rapid growth since further additions of $K_2Cr_2O_7$ to the melt do not improve crystal quality but do decrease the crystal growth rate, at least where a crystal growth habit in accordance with the present invention is utilized.

Growth runs having a duration of five to six weeks are utilized without producing sufficient quantities of undesired crystals to interfere with the proper growth of the desired seed crystals when the above-described flux is about 4-6" deep and the temperature gradient is produced by holding the temperature, at the upper surface of the melt at approximately 1050°-1100° C. and temperature at the lower surface of the melt approximately 20° C. lower. Under such condition, the crystal will grow at a rate of 0.4-1 mm/wk with minimum inclusions and defects. Faster growth rates may be obtained by increasing the temperature gradient in the flux, however this increase in growth rate increases the danger of the formation of defects and inclusions within the crystal as well as increasing the nucleation rate of undesirable and competitive crystals.

In accordance with the invention, seed crystals are carefully selected and nurtured which have particular characteristics which the prior art considered undesirable. The preferred crystal habit comprises a pyramidal crystal having a thin, often very slightly tapered, conical, axial core which is the inversion twin of the remainder of the crystal. The axial core has a centrally located screw dislocation which appears to aid the crystal growth. This crystal configuration is referred to as an inversion twin core structure. The presence of the inversion twin core was considered undesirable because such a crystal as a whole is not of the quality desired because the inversion twin has different characteristics than the remainder of the crystal. A detailed discussion of inversion twins may be found in the following articles which are interrelated and form a series presenting differing aspects of inversion twins in BeO. These articles are incorporated herein by reference.

"Growth and Properties of Beryllium Oxide Single Crystals", Austerman, *Journal of Nuclear Materials* 14 (1964) pp 225-236.

"Study of Defect Structures in BeO Single Crystals by X-Ray Diffraction Topography", Austerman et al, *Journal of Applied Physics*, Vol. 36, No. 12 (1965) pp 3815-3822.

"The Inversion Twin: Prototype in Beryllium Oxide", Austerman et al, *Journal of Materials Science*, 1 (1966) pp 249-260.

"Etching Studies of Beryllium Oxide Crystals", Austerman et al, *Journal of Materials Science*, 2 (1967) pp 378-387.

"Growth-Related Defects and Growth Processes in BeO Crystals" Austerman et al, *Crystal Growth*, 1967 pp 813-815.

"X-Ray Diffraction Contrast of Inversion Twin Boundaries in BeO Crystals", Chikawa and Austerman, *Journal of Applied Crystallography*, Vol. 1, part 3, September 1968, pp 165-171.

It is preferred to nucleate the seed crystal directly on removable, platinum, crystal-mounting wires since this minimizes handling and defects. The nature and duration of the growth process is such that crystals inherently nucleate spontaneously during a growth run. Although most of these crystals nucleate on the bottom of the crucible, some nucleate on the support rig 30 or support wire 36. Consequently, provision of unoccupied support wires 36 makes it possible to obtain high quality crystals nucleated directly on platinum wires. Although direct nucleation of the crystals on support wires is preferred, acceptable results are also obtained by careful selection of high quality crystals which have nucleated on the bottom of the crucible.

Figure 2:
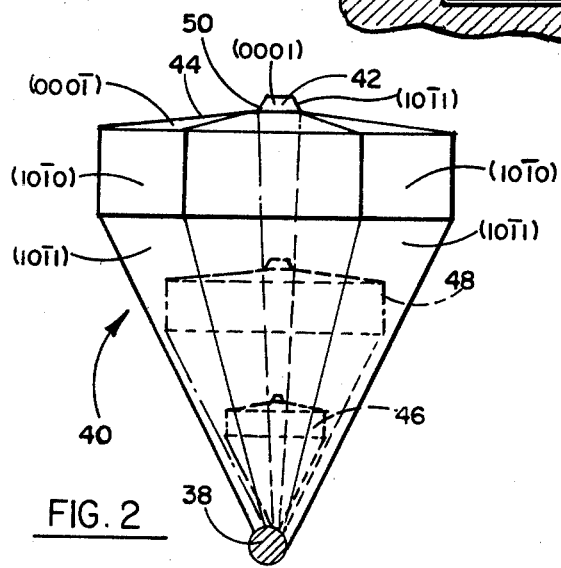
FIG. 2 illustrates a BeO crystal grown by the method of the present invention.

A crystal 40 in accordance with the inversion twin core structure is illustrated schematically in FIG. 2. The crystal 40 nucleated on a platinum wire 38 and has an axial inversion twin core 42 surrounded by host material 44. The configuration of the crystal at earlier stages of growth is illustrated in phantom at 46 and 48 within the crystal 40. It will be apparent, that slow growth takes place on the $(10\bar{1}1)$ faces of the pyramid which converge to form the point of the pyramid while much faster growth takes place on the vicinal $(000\bar{1})$ face through which the axial inversion twin core protrudes. Fairly fast growth also occurs on the side $(10\bar{1}0)$ faces which connect the pyramidal $(10\bar{1}1)$ faces to the vicinal $(000\bar{1})$ face through which the axial twin protrudes. The side $(10\bar{1}0)$ faces grow outward and consequently along their lower edges form $(10\bar{1}1)$ pyramidal faces which are slow growing faces. The growth of the vicinal $(000\bar{1})$ face (through which the axial twin core protrudes) adds to the vertical dimension of the $(10\bar{1}0)$ faces at the same time as the formation of the pyramidal $(10\bar{1}1)$ faces subtracts from the vertical dimension of the faces. Consequently, it is the fast growth on the vicinal $(000\bar{1})$ face which enables the continued rapid growth of the crystal. In BeO, this characteristic is unique to this axial twin core growth habit. So far as is known, all other habits of BeO crystal growth eventually cease rapid growth by virtue of the rapidly growing faces growing out of existence and being replaced by slow growing faces.

Figure 3:
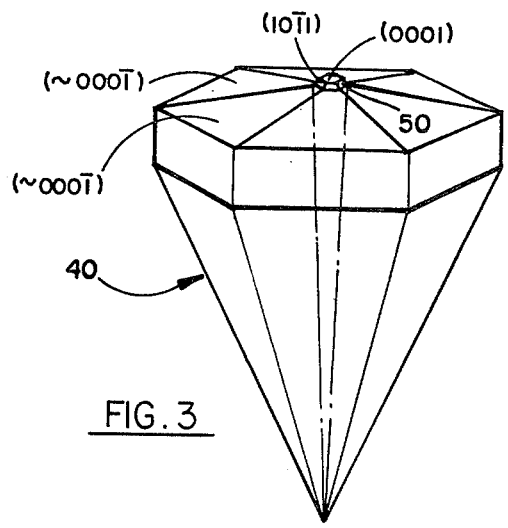
FIG. 3 is a perspective view of a BeO crystal grown in accordance with the invention illustrating the primary crystallographic planes bounding the crystal.

FIG. 3 presents a perspective view of the crystal 40 which illustrates in more detail the nature of the vicinal $(000\bar{1})$ surface of the crystal through which the inversion twin core protrudes. The upper surface of the inversion twin core is a $(0001)$ face of the BeO crystal. This face is bounded by $(10\bar{1}1)$ faces which are within the inversion twin core. The surface of the host crystal through which this inversion twin core extends is a vicinal $(000\bar{1})$ face of the crystal. A reentrant angle is formed at the juncture 50 of the $(10\bar{1}1)$ faces of the twin core and the vicinal $(000\bar{1})$ face of the host material.

The existence of the reentrant angle at the junction of the $(10\bar{1}1)$ faces of the twin core and vicinal $(000\bar{1})$ face of the host material is believed to be crucial to the fast axial and long-term continued growth of beryllium oxide crystals in accordance with the invention. The reentrant angle is believed to constitute an energetically favorable point for the nucleation of growth steps on the vicinal (000$\bar{1}$) face of the crystal. These growth steps propagate outward across (000$\bar{1}$) face. The resulting rapid advance of this vicinal (000$\bar{1}$) face causes the crystal to grow in the direction of the axis of the twin core at a fast enough rate that the fast growing (10$\bar{1}$0) lateral faces of the crystal are added to in an upward direction at a rate is as great as or greater than the rate at which the vertical dimension of the (10$\bar{1}$0) faces is reduced by conversion to (10$\bar{1}$1) faces. This assures the sustainability of the rapid growth.

Figure 4:
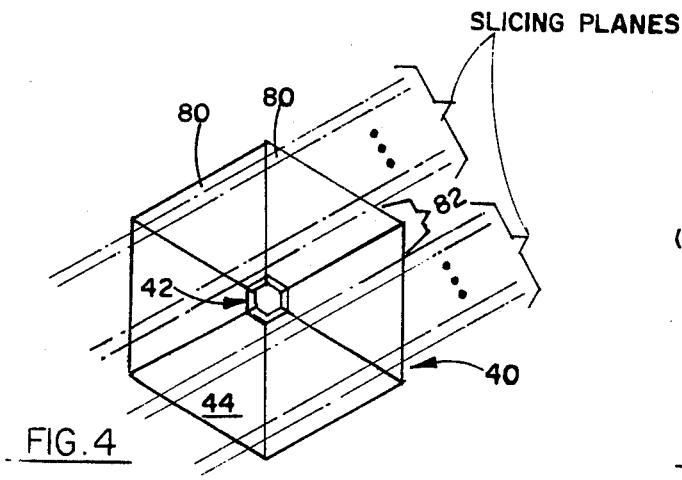
FIG. 4 illustrates in plan view the growth face of a crystal and how the crystal may be sliced to produce monocrystalline BeO wafers.

Once the BeO crystal has grown to the desired size in the inversion twin axial core configuration, the crystal may be sliced to form a large number of monocrystalline BeO wafers 80 which are twin-free. The manner of slicing the crystal into BeO wafers is illustrated in FIG. 4 which is a plan view looking at the vicinal (000$\bar{1}$) growth face of the axial-core inversion-twin crystal of FIG. 3. The wafers are preferably sliced parallel to a (10$\bar{1}$0) face of the crystal in order that they will have a (10$\bar{1}$0) face as their major surface. In slicing the crystal, a central slab 82 is preferably left which completely encloses the inversion twin core 42 with host material 44 except where the core protrudes through the vicinal (000$\bar{1}$) face. This central slab 82 may then be subjected to further growth in a flux in accordance with the invention to further enlarge the crystal. Growth on slab 82 will take place in a rapid manner both in the axial direction and laterally on the (10$\bar{1}$0) faces of the slab. Before growth on slab 82 is begun, it is preferable to polish the cut faces of the slab and perform a shallow etch in order to remove mechanically induced surface defects which could propagate into newly grown material.

The twin-free wafers 80 cut from the crystal may be utilized in a number of ways. First they may be utilized in the manner ultimately intended for the BeO crystal such as for substrates for the deposition of other material such as monocrystalline semiconductors or they may be utilized for further growth of monocrystalline BeO. If they are to be utilized for further growth of monocrystalline BeO, the wafers 80 should be polished on both major surfaces and lightly etched to remove mechanical surface damage before being mounted for further crystal growth. In order to facilitate mounting the wafers for further crystal growth, it is preferable to drill small holes at appropriate locations of the wafer to facilitate mounting of the wafers on crystal support wires for further growth. The holes should be drilled prior to polishing or etching the wafer, in order that the mechanical damage induced by the drilling may be eliminated by etching prior to polishing. Once the wafer has been properly prepared for further growth, a platinum wire is preferably strung through each drilled hole in order to attach the crystal to the crystal support rig in the manner previously described.

Figure 5:
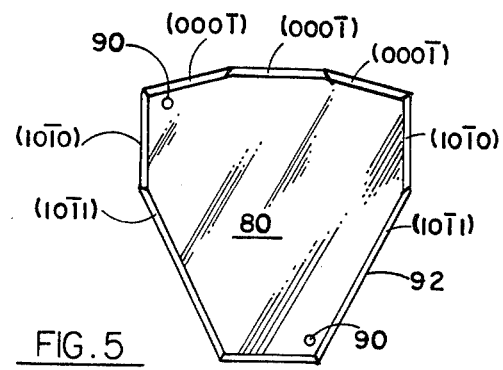
FIG. 5 illustrates a BeO wafer cut in accordance with FIG. 4 from a BeO crystal in accordance with the invention.

One wafer 80 sliced from crystal 40 of FIG. 4 is illustrated in FIG. 5 where the location for the holes to be drilled for use in supporting the crystal are identified by reference numeral 90. The locations of these holes are selected to yield a maximum-size continuous wafer. It will be understood, that the locations of these holes are purely illustrative and in fact the desired location of the hole will depend in part on the overall shape of the wafer and its intended use.

When utilized as seed plates for further crystal growth the twin free wafers 80 sliced from crystal 40 of FIG. 4 will grow rapidly along the (10$\bar{1}$0) faces and much less rapidly along the (000$\bar{1}$) and the (10$\bar{1}$1) faces. The major (10$\bar{1}$0) faces will grow out of existence by conversion to (10$\bar{1}$1) faces as the crystal thickens by growth. Despite the fact that the fast growing (10$\bar{1}$0) major faces of the seed plate will grow out of existence, a substantial thickness of monocrystalline BeO may be grown on the seed plate before a substantial reduction in the volume growth rate of the BeO occurs. This is because of the large size of the (10$\bar{1}$0) major faces of the seed plate. Once the volume growth rate of the BeO or the size of the (10$\bar{1}$0) major faces becomes too small for further growth on that seed plate to be desirable, that seed plate may be sliced to form additional wafers having (10$\bar{1}$0) major faces for further use as seed plates, substrates or other ultimate uses.

In slicing a crystal to form seed plates for further growth of monocrystalline BeO, it is important that the seed plate orientation be controlled to be within about one degree of (10$\bar{1}$0). If the seed plate orientation deviates from the (10$\bar{1}$0) orientation by more than about one degree, inclusions can form at the plate surface as growth commences. This presumably is due to rapid growth at an angle to the face of the seed plate. The formation of inclusions in the growing crystals reduces the utility of the resulting crystalline material for many applications. However, to a certain extent the inclusions in a monocrystalline BeO seed plate may be tolerated since in the growth environment in accordance with the present invention inclusions tend to heal over with continued growth and not destroy the single crystallinity of the material for small quantities of inclusions.

If desired, once an inversion-twinned crystal has grown to a desired size, it may be sliced perpendicular to the axis of the twin core to provide multiple seed plates on which further growth may be provided. However, it has been found that in most instances good quality growth is obtained only on the side of the plate which in the original crystal was away from the nucleation point of the crystal. On the side of the plate which in the original crystal was toward the nucleation point of the crystal the newly grown material is generally monocrystalline but contains channels parallel to the central crystal axis. Once the slab has grown to the desired size, it may be cut parallel to (10$\bar{1}$0) planes of the crystal to form wafers in the manner described previously with respect to crystal 40. As a result of the pores, the resulting wafers will only be solid monocrystalline material from what was the seed plate in a direction away from the nucleation point of the crystal and will be monocrystalline but porous in the portion of the material from what was the seed plate toward the direction of nucleation of the crystal. However, if these wafers are then utilized for further growth, the pores will generally heal over and the overgrowth material will be monocrystalline and of high quality across the entire wafer. In this way, the number of large crystals may be increased more rapidly than would be possible through attempts to initiate the growth of a new crystal at the time of slicing an existing large crystal.

Although the invention has been described in terms of the preferred flux composition, it will be recognized that the technique of utilizing inversion twin axial core BeO crystals to obtain rapid growth of monocrystalline BeO is independent of the particular growth system utilized.

The invention has been discussed in terms of the preferred embodiments and those skilled in the art will be able to introduce substantial variations without departing from the spirit and scope of the invention. The patent coverage for this invention is limited only by the appended claims.

What is claimed is:

1. A method of rapidly growing substantially defect-free monocrystalline BeO, said method comprising:
    (a) mixing source materials to produce an alkali metal molybdate flux as flux conditioners 0.001–0.1 weight percent $SiO_2$ and quantities of materials selected from the group consisting of compatible sources of metal ions in quantities equivalent to 0.001–0.1 weight percent of the corresponding metal oxide;
    (b) heating said source materials in a substantially inert crucible to form a liquid melt;
    (c) locating a source of BeO where it will dissolve into a high-temperature source-dissolution region of the melt;
    (d) establishing a temperature gradient in said melt from said source-dissolution portion of the melt to a crystal growth region of the melt which is at a lower temperature which renders the growth region of the melt super-saturated with BeO;
    (e) stirring said melt to provide a continuous fluid flow of said melt over surfaces in the crystal growth region of the melt and to increase the temperature uniformity within the crystal growth region of the melt;
    (f) selecting, from those whch nucleated on substantially inert wires in the melt and those which nucleated on other surfaces, substantially defect-free monocrystals of BeO which exhibit an inversion twin axial core structure;
    (g) inserting at least some of said selected crystals into a melt having a composition in accordance with step (a), said selected crystals being in a crystal growth region of the melt to promote additional growth on the selected crystals;
    (h) removing the selected crystals from the melt before spontaneous nucleation of additional crystals, depletion of the BeO source, or interference by non-selected crystals prevents continued growth of good quality crystals;
    (i) repeating steps g and h until a crystal reaches a desired size.

2. The method recited in claim 1 wherein said source materials which produce the alkali metal molybdate flux comprise about 10 to 50 weight percent $K_2CO_3$ and about 90 to 50 weight percent $MoO_3$.

3. The method recited in claim 2 wherein said flux conditioners comprise 0.001–0.1 weight percent $SiO_2$ and source materials which produce a quantity of metal ions equivalent to 0.001–0.1 weight percent of materials selected from the group consisting of $K_2Cr_2O_7$, MgO, $Al_2O_3$, CaO and $Fe_2O_3$.

4. The method recited in claim 1 further comprising, prior to at least one performance of step (g) performing the step of:
    removing some non-selected crystals from the wires and/or crucible.

5. The method recited in claim 1 further comprising a step:
    slicing a selected crystal of the desired size to form individual, twin-free, monocrystalline BeO wafers.

6. The method recited in claim 1 further comprising, prior to at least one performance of step (g), performing the step of:
    mounting on wires some of the selected crystals which did not nucleate on wires.

7. The method recited in claim 6 wherein said mounting step comprises:
    drilling a hole in the crystal;
    etching the crystal to remove any machining-induced damage which would interfere with the growth of good quality monocrystalline BeO on said crystal; and
    inserting a substantially inert wire through the hole.

8. The method recited in claim 2 wherein:
    said $K_2CO_3$ constitutes approximately 25 weight percent of said source materials; and
    said $MoO_3$ constitutes approximately 75 weight percent of said source materials.

9. The method recited in claim 8 wherein said flux conditioners are $SiO_2$ and $K_2Cr_2O_7$.

10. The method recited in claim 9 wherein:
    said $SiO_2$ constitutes approximately 0.005 weight percent of said source materials; and
    said $K_2Cr_2O_7$ constitutes approximately 0.07 weight percent of said source materials.

11. The method recited in claim 2 wherein at least a portion of said melt is held at a temperature in the approximate range of 1050° C. to 1100° C. during a substantial portion of a growth run.

12. A method of rapidly growing substantially defect-free monocrystalline BeO, said method comprising:
    (a) mixing source materials comprising about 10 to 50 weight percent $K_2CO_3$, about 90 to 50 weight percent $MoO_3$, and as flux conditioners 0.001–0.1 weight percent $SiO_2$ and 0.001–0.1 weight percent of materials selected from the group consisting of $K_2Cr_2O_7$, MgO, $Al_2O_3$, CaO and $Fe_2O_3$;
    (b) heating said source materials in a substantially inert crucible to form a liquid melt;
    (c) locating a source of BeO where it will dissolve into a source-dissolution region of the melt held at a temperature in the range of approximately 1050° C. to 1100° C.;
    (d) establishing a temperature gradient in said melt from said source dissolution region of the melt to a crystal growth portion of the melt which is at a temperature of between 10° C. and 40° C. lower than the temperature of the source dissolution region of the melt;
    (e) providing substantially inert wires in the crystal growth region of the melt as nucleation sites for the spontaneous nucleation of BeO monocrystals;
    (f) stirring said melt to provide a continuous fluid flow of said melt over said inert wires and to increase the temperature uniformity within the crystal growth region of the melt;
    (g) removing the inert wires and any crystals nucleated thereon from the melt at some time after sufficient time has elapsed for BeO crystals to have nucleated on said wires;
    (h) selecting from the BeO crystals nucleated on said wires substantially defect-free BeO monocrystals which exhibit an inversion twin axial core structure;
    (i) retaining said selected BeO crystals on said wires;
    (j) inserting the wires supporting at least some of the selected crystals into a melt of substantially the above-specified composition with the selected crystals in a crystal growth region of the melt to promote additional growth on the selected crystals;

(k) removing the wires and the selected crystals from the melt before spontaneous nucleation of additional crystals, depletion of the BeO source, or interference by non-selected crystals prevents continued growth of good quality crystals;

(l) repeating steps j and k until a crystal reaches a desired size; and (m) slicing a selected crystal of the desired size to form individual, twin-free monocrystalline BeO wafers.

13. The method recited in claim 10 further comprising prior to at least one performance of step (j) performing the step of:

removing at least some non-selected crystals from said wires and/or said crucible.

14. A method for forming a large mono crystalline, twin-free, BeO crystal comprising:

(a) growing a monocrystalline BeO parent crystal having an axial inversion twin core wherein at least part of said parent crystal is grown in a flux melt formed from about 10 to 50 weight percent $K_2CO_3$, about 90 to 50 weight percent $MoO_3$, 0.001–0.1 weight percent $SiO_2$ and 0.001–0.1 weight percent of materials selected from the group consisting of $K_2Cr_2O_7$, MgO, $Al_2O_3$, CaO and $Fe_2O_3$; and (b) deriving an inversion-twin-free BeO monocrystal from said parent BeO crystal.

15. The method recited in claim 14 further comprising:

(c) growing additional monocrystalline BeO on said derived crystal.

16. The method recited in claim 15 wherein said step (c) comprises growing the additional BeO on said derived crystal in a flux melt formed from about 10 to 50 weight percent $K_2CO_3$, about 90 to 50 weight percent $MoO_3$, 0.001–0.1 weight percent $SiO_2$ and 0.001–0.1 weight percent of materials selected from the group consisting of $K_2Cr_2O_7$, MgO, $Al_2O_3$, CaO and $Fe_2O_3$.

* * * * *